US005517345A

United States Patent [19]

Joaille

[11] Patent Number: 5,517,345

[45] Date of Patent: May 14, 1996

[54] ELECTRONIC APPARATUS FOR AN AUTOMOBILE

[75] Inventor: Jean-Patrick Joaille, Bonnelles, France

[73] Assignee: U.S. Philips Corporation, New York, N.Y.

[21] Appl. No.: 135,766

[22] Filed: Oct. 12, 1993

[30] Foreign Application Priority Data

Oct. 28, 1992 [FR] France .................................. 92 12881

[51] Int. Cl.[6] ............................ H04B 10/00; H05K 11/02

[52] U.S. Cl. .................... 359/146; 359/142; 340/825.31; 455/151.2; 455/152.1; 455/346

[58] Field of Search .................................... 359/147, 146, 359/144, 142, 148; 455/151.1, 346, 151.2, 152.1; 368/223–224, 277–278; 340/825.69, 825.31, 825.72, 825.44

[56] References Cited

U.S. PATENT DOCUMENTS

| | | | |
|---|---|---|---|
| 3,763,646 | 10/1973 | Jeanmonod | 58/58 R |
| 4,573,046 | 2/1986 | Pinnon | 340/825.56 |
| 4,947,457 | 8/1990 | Shin | 455/346 |
| 5,109,420 | 4/1992 | Nonaka | 455/151.1 |
| 5,216,641 | 6/1993 | Hoel | 368/223 |
| 5,299,265 | 3/1994 | Hayama | 455/346 |
| 5,349,326 | 9/1994 | Yamada | 455/346 |
| 5,363,122 | 11/1994 | Suenaga | 455/346 |

FOREIGN PATENT DOCUMENTS

| | | | |
|---|---|---|---|
| 0253947 | 1/1988 | European Pat. Off. . | |
| 5147474 | 6/1993 | Japan | 455/346 |
| 6046000 | 2/1994 | Japan | 455/346 |

*Primary Examiner*—Leslie Pascal
*Attorney, Agent, or Firm*—Leroy Eason

[57] ABSTRACT

An electronic apparatus for installation in an automobile, such as a radio receiver, includes in a removable part thereof elements which are indispensable to the operation of the apparatus and also elements whereby the removable part can serve an independent function. If, for example, the indispensable elements include a key and a display screen, then simply by also including an audio element in the removable part a parking timer can be formed which alerts the holder of the key against overtime parking.

5 Claims, 1 Drawing Sheet

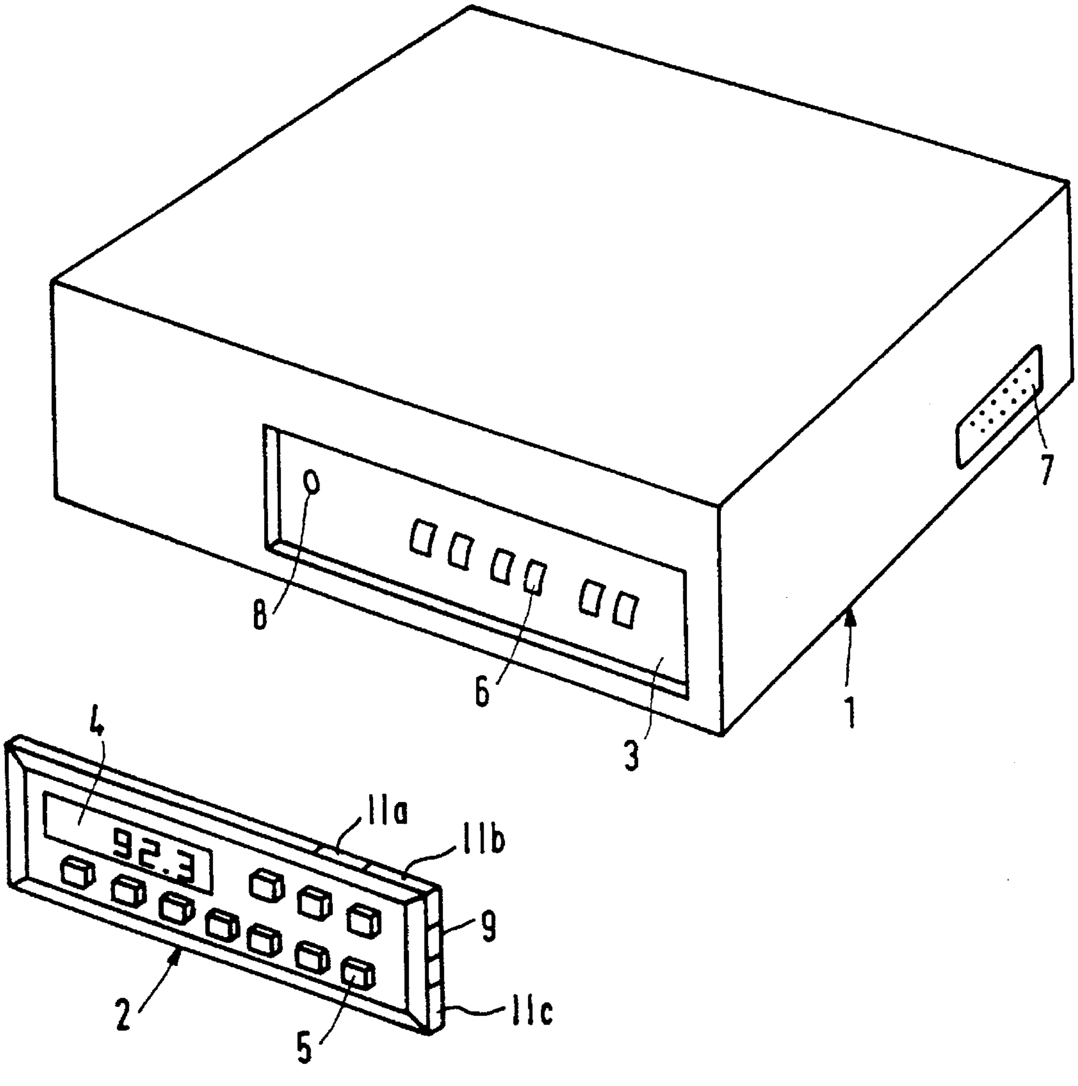
1
2
3
4
5
6
7
8
9
11a
11b
11c
92.3

ELECTRONIC APPARATUS FOR AN AUTOMOBILE

FIELD OF THE INVENTION

The invention relates to an electronic apparatus for an automobile, comprising a removable panel in which there are accommodated elements which are indispensable to the functioning of the apparatus and which is provided with manually operable touch keys and a display screen.

An apparatus of this kind is, for example, an anti-theft radio receiver; it is protected against theft because the removable panel has essential functions and, consequently, use of the receiver is impossible when said panel has been removed and is carried, for example in the pocket of the user.

BACKGROUND OF THE INVENTION

A car radio receiver comprising such a removable anti-theft part is known from the document EP-A-0 253 947.

SUMMARY OF THE INVENTION

It is an object of the invention to increase the possibilities offered by such a removable panel.

To this end, the apparatus in accordance with the invention is characterized in that said removable panel is provided with at least an additional circuit which has a function which is independent of said electronic apparatus. The invention is based on the idea that elements present in the removable panel can be used to good advantage to provide unexpected additional services.

The additional circuit may be a programmable timer circuit, the removable panel comprising means for programming the timer circuit by means of said keys, and an audio element which is triggered by the timer circuit when the programmed time has expired.

Thus, the user has a means for being informed that, for example his parking time has expired, without being necessary to purchase a timer and being burdened thereby. Such a separate timer, in an electronic implementation, would also comprise its own display screen and its own keys, even though these elements are already present in the removable panel of the apparatus.

The removable panel preferably comprises means for displaying, upon request, the programmed time on the display screen.

The removable panel preferably comprises a memory, means for entering data therein by means of said keys, and means for displaying said data on the display screen. It can thus also serve as a notebook.

Preferably, said removable panel comprises a generator circuit which is capable of generating several different pulse sequences, and means for transmitting, upon request, one of these sequences by means of infrared light.

Said removable panel can thus be used for remote control of given functions of the apparatus or the vehicle, for example the audio volume or the wavelength of the radio receiver, the setting of the clock, control of the air conditioning, etc.

For an automobile which is already equipped with an infrared remote control system for locking and unlocking its doors, it is feasible to provide said removable panel with a generator circuit capable of generating a sequence of coded pulses which are suitable to control the locks of the vehicle, and with means for despatching said pulse sequence, by means of infrared light emitted by an electroluminescent diode when one of the keys is pressed.

Thus, the user need not carry a key for opening the doors in addition to said removable panel.

The invention can be advantageously used for any on-board electronic apparatus comprising a display and control keys, but notably for a radio receiver or an on-board clock.

BRIEF DESCRIPTION OF THE DRAWINGS

These aspects of the invention as well as other more detailed aspects will become apparent from the following description of a non-limitative preferred embodiment.

The sole FIGURE is a perspective view of an apparatus in accordance with the invention, comprising a removable panel.

DESCRIPTION OF A PREFERRED EMBODIMENT

The following description relates, by way of example, to an automobile electronic apparatus which is a radio receiver. Obviously, except for given characteristics which are specific to a radio receiver, description also holds for any other kind of electronic on-board apparatus comprising a removable panel which accommodates elements implementing an indispensable function of the apparatus and which includes touch keys and a display screen.

The car radio receiver shown comprises a main body 1 which can engage a removable front panel 2 to be located in a receptacle 3, on the bottom of which there are provided electric contacts 6 enabling interconnections to be established between the removable panel 2 and the body 1 of the receiver when the removable panel is in place in the receptacle 3.

Inside the removable panel 2 there are provided one or more circuit elements which implement an indispensable function of the receiver, an example of such an element being a tuner 11*a*. The panel also comprises keys 5 for controlling the tuner function and a display screen 4 for displaying the results obtained by means of the relevant command. The keys may be, for example keys marked "+" and "–" which increase and decrease, respectively, the frequency of the tuner 11*a*, the screen displaying the value of said frequency as it changes. There may also be provided numbered keys for selecting channels or for introducing a frequency by way of its digital value, and so on. In the case of a clock, the screen serves to display the time and the keys serve to set the clock.

The removable panel can be provided with a programmable timer circuit 11*b*. In the case of a clock, almost the entire clock, together with its timer circuit, would be included in the removable panel and special keys provided for programming the timer circuit. The keys provided for the tuner of the radio receiver or for setting the clock may also serve to program the timer circuit, for example if at the same time another key is to be pressed so as to impart a second significance to given keys. An audio element 11*c* is provided so as to be triggered by the programmable timer circuit when the programmed time has expired.

Those skilled in the art will be capable of realising a readily programmable timer circuit: in contemporary radio receivers a microprocessor is provided to control the functions of the tuner as well as the display and this microprocessor can be programmed in known manner so as to constitute a timer, to "read" the actuation of given keys, and to realise software branching in response thereto.

The programmed time is displayed on the display screen. This can take place permanently when the timer function is chosen, thus indicating the decreasing time remaining. It may also be that the time is displayed only when given keys are pressed.

The removable panel may comprise a memory in which data can be introduced. The microprocessor controls the input of data into the memory by means of said keys upon actuation by the user and subsequently, when given keys are pressed, the data is output from the memory and displayed on the display screen.

The removable panel may also comprise a circuit for generating infrared coded pulse sequences which, when so instructed, generates several different pulse sequences. These pulse sequences can be obtained by means of the same microprocessor, associated with an amplifier for amplifying the pulses and applying the pulses to an electroluminescent diode 9 in order to transmit said pulse sequence by means of infrared light. Special keys can again be provided for triggering the transmission of said pulse sequence, but this function can also be performed by keys provided for the tuner.

The main body 1 of the radio receiver 1 comprises an infrared light receiving element 8 and decoding circuits (not shown) which are known per se for interpreting the various pulse sequences received by the receiving element 8 and for responding thereto as is common practice in, for example television receivers, for controlling parameters such as the audio volume, the stereo balance etc. When the removable panel is fitted in the receptacle 3, the same pulse sequences are conductively transmitted via the contacts 6 and have the same effects.

When the automobile is equipped with a system for locking or unlocking its doors by infrared remote control, the pulse generator circuit is arranged to generate, again under the control of ad hoc programming of the microprocessor and by means of the same amplifier and the same electroluminescent dime, pulses which are suitable for controlling the locks of the vehicle. The removable panel can then be used instead of the conventional remote control key for locking and unlocking the doors of the vehicle.

In addition to the anti-theft effect provided by removal of the removable panel, the body of the receiver can be provided with a system for locking its functions, which system can be unlocked by means of a secret code supplied in the form of a pulse sequence. When the automobile is equipped with a bus (not shown) for transmitting the instructions of a central locking or unlocking system for the doors, the body of the receiver is provided with a connector 7 for connection to said bus. This connector is shown to the left of the body so as to be visible; in practice, however, it will always be arranged at the rear.

The pulse sequence constituting the secret code for opening the doors is transmitted via said bus, and hence applied to the connector 7, by way of a central door locking/unlocking system when the driver unlocks the doors by means of his remote control key or the removable part. The main body of the receiver comprises means for recognizing the electric pulse sequence applied to the connector 7 via the bus. The radio receiver is thus locked and unlocked at the same time as the doors and by the same code.

When the removable panel is detached from the receiver, it is powered by means of one or more compact batteries.

Even though the removable panel is shown to be flat and designed to be accomodated on the front face of the receiver, it will be evident that it can also be introduced, for example into a slit in the front in the same way as a credit card is inserted into a card reader.

When a vehicle is not equipped with an infrared remote control, several characteristics of the invention nevertheless hold: the removable panel, comprising a timer, may also comprise an infrared control for the functions of a radio and a notebook memory. Moreover, the system for locking the functions of a receiver, being unlockable by means of a secret code supplied in the form of a pulse sequence, can be operated by a bus even when the central locking or unlocking system is operated by means of a conventional mechanical key.

I claim:

1. An electronic apparatus for installation in a motor vehicle, said apparatus comprising a removable panel in which is accommodated circuit elements which implement an indispensable function of the apparatus, so that without said panel said apparatus is inoperative; said circuit elements including touch keys and a display screen; characterized in that said panel further accommodates an additional circuit element which, when said panel is removed from said apparatus, cooperates with said touch keys and said display screen to implement a further function other than said indispensable function of said apparatus.

2. An electronic apparatus as claimed in claim 1, characterized in that said apparatus is a radio receiver.

3. An electronic apparatus as claimed in claim 1, characterized in that said apparatus is an on-board clock.

4. An electronic apparatus as claimed in claim 1, wherein said additional circuit element comprises: a programmable timer circuit, means for programing said timer circuit to measure a time interval selected by operation of said touch keys, and an audio element which is triggered by said timer circuit when said programmed time interval has expired.

5. An electronic apparatus as claimed in claim 4, wherein said timer circuit controls said display screen to display remaining time of said programmed time interval.

* * * * *